United States Patent
Richet et al.

(10) Patent No.: US 10,227,684 B2
(45) Date of Patent: Mar. 12, 2019

(54) METHOD FOR DEPOSITING A CORROSION-PROTECTION COATING FROM A SUSPENSION

(71) Applicants: L'Air Liquide, Societe Anonyme pour l'Etude et l'Exploitation des Procedes Georges Claude, Paris (FR); Centre National De La Recherche Scientifique, Paris (FR); Universite De Lorraine, Nancy (FR)

(72) Inventors: Nicolas Richet, Fontenay-le-Fleury (FR); Thierry Mazet, Nancy (FR); Michel Vilasi, Bouxieres aux Dames (FR); Stephane Mathieu, Villers les Nancy (FR)

(73) Assignees: L'Air Liquide Societe Anonyme Pour L'Etude Et L'Exploitation Des Procedes Georges Claude, Paris (FR); Centre National De La Recherche Scientifique, Paris (FR); Universite De Lorraine, Paris (FR)

( * ) Notice: Subject to any disclaimer, the term of this patent is extended or adjusted under 35 U.S.C. 154(b) by 412 days.

(21) Appl. No.: 14/767,803

(22) PCT Filed: Feb. 4, 2014

(86) PCT No.: PCT/FR2014/050194
§ 371 (c)(1),
(2) Date: Aug. 13, 2015

(87) PCT Pub. No.: WO2014/125188
PCT Pub. Date: Aug. 21, 2014

(65) Prior Publication Data
US 2015/0376757 A1    Dec. 31, 2015

(30) Foreign Application Priority Data
Feb. 13, 2013 (FR) .................................... 13 51228

(51) Int. Cl.
C23C 2/04      (2006.01)
B05D 5/00      (2006.01)
(Continued)

(52) U.S. Cl.
CPC .................. *C23C 2/04* (2013.01); *C23C 4/12* (2013.01); *C23C 10/02* (2013.01); *C23C 10/20* (2013.01);
(Continued)

(58) Field of Classification Search
CPC .. B05D 1/00; C23C 2/04; C23C 16/44; C23C 14/22; C23C 4/12; C23C 10/20; C23C 10/60; C23C 10/02
See application file for complete search history.

(56) References Cited

U.S. PATENT DOCUMENTS 6,497,920 B1 * 12/2002 Pfaendtner .............. C23C 10/20
427/229
2007/0009660 A1    1/2007 Sasaki et al.
2010/0015473 A1 * 1/2010 Hendriksen ......... H01M 8/2425
429/486

FOREIGN PATENT DOCUMENTS

EP    1 186 680    3/2002
EP    2 060 653    5/2009
(Continued)

OTHER PUBLICATIONS

Ramezani et al., titled: Mechanical milling of aluminum powder using planetary ball milling process, Dec. 1, 2012, Journal of Achievements in Materials and Manufacturing Engineering, vol. 55, issure 2, pp. 790-798.*
(Continued)

*Primary Examiner* — Charles Capozzi
*Assistant Examiner* — Hai Y Zhang
(74) *Attorney, Agent, or Firm* — Christopher J. Cronin

(57) ABSTRACT

Process for depositing a coating on a substrate having at least one cavity, comprising a step of mixing ground powders of an activating agent and a powder of the metal or of the alloy to be deposited on the substrate that were ground in step a) and a liquid so as to form a suspension, and a step of applying the suspension to the portion of the substrate to be coated.

12 Claims, 2 Drawing Sheets

(51) Int. Cl.
| | |
|---|---|
| *B05D 1/00* | (2006.01) |
| *C23C 10/02* | (2006.01) |
| *C23C 10/20* | (2006.01) |
| *C23C 10/60* | (2006.01) |
| *C23C 4/12* | (2016.01) |
| *C23C 14/22* | (2006.01) |
| *C23C 16/44* | (2006.01) |

(52) U.S. Cl.
CPC .............. *C23C 10/60* (2013.01); *C23C 14/22* (2013.01); *C23C 16/44* (2013.01)

(56) References Cited

FOREIGN PATENT DOCUMENTS

| | | |
|---|---|---|
| EP | 2 305 853 | 4/2011 |
| EP | 2 392 685 | 12/2011 |
| EP | 2 540 857 | 1/2013 |

OTHER PUBLICATIONS

Skylighter, https://www.skylighter.com/blogs/fireworks-information/mesh-to-micron-conversion-chart.*
Chegg, http://www.chegg.com/homework-help/questions-and-answers/internal-air-passage-used-cool-gas-turbine-blade-approximated-tube-3-mm-diameter-75-mm-len-q8647319).*
American Elements, https://www.americanelements.com/titanium-aluminum-vanadium-ti6al4v.*
Written Opinion of the International Searching Authority for PCT/FR2014/050194, dated Aug. 27, 2015; with English translation.
International Search Report for PCT/FR2014/050194, dated May 13, 2014.
French Search Report and Written Opinion or FR 1 351 228, dated Dec. 18, 2013.

* cited by examiner

METHOD FOR DEPOSITING A CORROSION-PROTECTION COATING FROM A SUSPENSION

CROSS-REFERENCE TO RELATED APPLICATIONS

This application is a § 371 of International PCT Application PCT/FR2014/050194, filed Feb. 4, 2014, which claims § 119(a) foreign priority to French patent application FR1351228, filed Feb. 13, 2013.

BACKGROUND

Field of the Invention

The present invention relates to the production of a corrosion-protection coating on a substrate that has cavities.

Related Art

The techniques for producing coatings may be grouped into three large families:
thermal spraying,
chemical vapor deposition, and
physical vapor deposition.

Thermal spraying techniques such as plasma or flame spraying consist in sending molten or partially molten particles, at high velocity, to the surface of the part to be protected. The coating is constructed of successive layers. These techniques can only be used on open or readily accessible surfaces.

The vapor deposition techniques use a gaseous precursor of the coating to be produced. This precursor may be produced in direct proximity to the surface to be coated (pack cementation) or be transported via a gas to the surface to be coated (out of pack, CVD using a gas cylinder or mixture, . . . ). The main difficulties encountered for pack cementation are linked to the filling of parts that have a complex geometry or very small dimensions (several mm) with the cement powder (precursor mixture of the coating). The main limitations of techniques that use gaseous precursors relate to the rapid depletion of reactive species from the gaseous mixture leading to heterogeneities of chemical composition and/or of thickness of the coating. It is very difficult to obtain a uniform coating on large surfaces or in complex geometries.

The physical vapor deposition techniques consist in evaporating the constituent element(s) of the coating before condensing them on the surface of the part to be coated. The evaporation generally takes place by bombarding a target with a high-energy (electron or ion) beam. The distance between the target and the surface to be coated is a major parameter for the uniformity of the thickness of the deposition. These techniques are very difficult to use on parts of complex geometry or on inaccessible surfaces.

The intensification of industrial processes leads to materials being used under increasingly harsh conditions and to the size of the parts used being reduced.

In most cases, it is necessary to protect the parts from their surroundings with a coating. As presented in the preceding paragraphs, complex geometries and inaccessible surfaces pose problems for producing coatings using conventional techniques.

It is therefore necessary to develop new deposition techniques or to adapt the existing techniques to the new constraints.

Pack cementation is a very old process for producing a coating on a part. The latter is placed in a bed of cement powder, which is a mixture of products capable of generating a reactive atmosphere at high temperature. This cement must be placed in the vicinity of the surface to be coated in order to produce a coating that is uniform in terms of thickness and chemical composition. Coatings are conventionally produced on parts having cavities of several centimeters by filling the part with the cement powder.

However, when the cavities have characteristic sizes of the order of a millimeter, and high aspect ratios (length/width ratios), introducing the cement is much more complex. This is why processes using powder, of pack cementation type, are generally used for parts that have no or few zones that are difficult to access.

Hence, one problem that is faced is to improve the processes for depositing coating on surfaces that are difficult to access, i.e. surfaces that have cavities.

SUMMARY OF THE INVENTION

One solution of the present invention is a process for depositing a coating on a substrate having at least one cavity, comprising the following successive steps:
a) a step of grinding a powder of an activating agent and a powder of the metal or of the alloy to be deposited on the substrate;
b) a step of mixing the powders ground in step a) and a liquid so as to form a suspension;
c) a step of pickling the portion of the substrate to be coated;
d) a step of applying the suspension to the portion of the substrate to be coated;
e) a first step of heating the substrate-suspension assembly at a temperature of between 150° C. and 400° C. and for a duration of between 20 and 60 minutes so as to at least partly eliminate the liquid;
f) a second step of heating the substrate-suspension assembly resulting from step e) at a temperature of between 500° C. and the melting point of the least refractory element of the metal or of the alloy to be deposited and for a duration of between 1 and 10 hours so as to react the activating agent and the metal or the alloy to be deposited;
g) a step of eliminating the pulverulent residues; and
h) a step of recovering a substrate-coating assembly.

According to an alternative, the process according to the invention is a process for depositing a coating on a substrate having at least one cavity, comprising the following successive steps:
a) a step of grinding a powder of a pickling flux and a powder of the metal or of the alloy to be deposited on the substrate;
b) a step of mixing the powders ground in step a) and a liquid so as to form a suspension;
c) a step of pickling the portion of the substrate to be coated;
d) a step of applying the suspension to the portion of the substrate to be coated;
e) a first step of heating the substrate-suspension assembly at a temperature of between 50° C. and 300° C. and for a duration of between 30 min and 5 h so as to at least partly eliminate the liquid;
f) a second step of heating the substrate-suspension assembly resulting from step e) at a temperature above the melting point of the pickling flux for a duration of between 20 min and 6 h so as to react the pickling flux and the metal or the alloy to be deposited;

g) a step of eliminating the pickling flux powder residues; and h) a step of recovering a substrate-coating assembly.

An activating agent is a compound that forms a gaseous species with the precursor of the element to be deposited. This gaseous species will then be deposited on the surface of the part to be coated in order to form the coating. The activating agents may be fluorides or chlorides.

Depending on the case, the two processes according to the invention may have one or more of the following features:
  step e) is carried out under an atmosphere that is renewed every x minutes with 1 min≤x≤20 min;
  step f) is carried out under a static inert gas atmosphere, the inert gas being for example argon;
  in step b) at least one organic compound is added to the mixture;
  the organic compound is selected from binders, lubricants and dispersants;
  said process comprises, between step e) and step f), a step i) of heating the substrate-suspension assembly resulting from step e) at a temperature of between 400° C. and the melting point of the least refractory element of the metal or of the alloy to be deposited and for a duration of between 1 and 10 hours so as to eliminate or degrade the organic compounds;
  step i) is carried out under an atmosphere that is renewed every x minutes with 1 min≤x≤20 min;
  application step d) is carried out by immersing the substrate in the suspension; by injecting the suspension into the cavity of the substrate; or by brush application of the suspension to the cavity of the substrate;
  step g) of eliminating the residues is carried out by vibration or washing with aqueous solutions;
  said process comprises, after step h), a last step of heating the substrate-coating assembly at a temperature of between 900° C. and 1200° C. and for a duration of between 1 and 5 hours;
  the substrate has cavities of minimum equivalent diameter $e_{cm}$ and the grinding step a) is carried out so as to obtain only particles having an equivalent diameter d such that $d \leq e_{cm}/10$;
  the coating of the substrate-coating assembly recovered in step h) has a thickness of between 5 µm and 200 µm, preferably of between 5 and 80 µm, more preferably of between 20 and 60 µm;
  the substrate is selected from metallic substrates, for example based on iron or nickel, substrates made of alloy(s) or made of superalloy(s), composite substrates comprising one or more metals and/or alloy(s) and/or superalloy(s) containing Ni in order to react with the Al deposited and form NiAl.

The substrate is selected from the inside of tubes, turbine blades, heat exchangers, reactor exchangers, storage vessels, etc., preferably metallic heat exchangers.

The size of the cement particles may be measured by laser particle size analysis or screening in order to ensure that no cement particle or agglomerate of cement particles exceeds the required size.

A step of deagglomeration may be necessary in order to "break" the agglomerates of individual particles that may exceed the required size.

The sizes of the particles are conventionally within the range 1 µm to 1 mm, preferably 1 µm to 100 µm.

The equivalent diameter is defined as the diameter of the cylinder or of the circle that is inscribed within the smallest cross section giving access to the surface to be coated. Specifically, the latter does not necessarily have a standard shape.

DETAILED DESCRIPTION OF THE INVENTION

Figure 1:
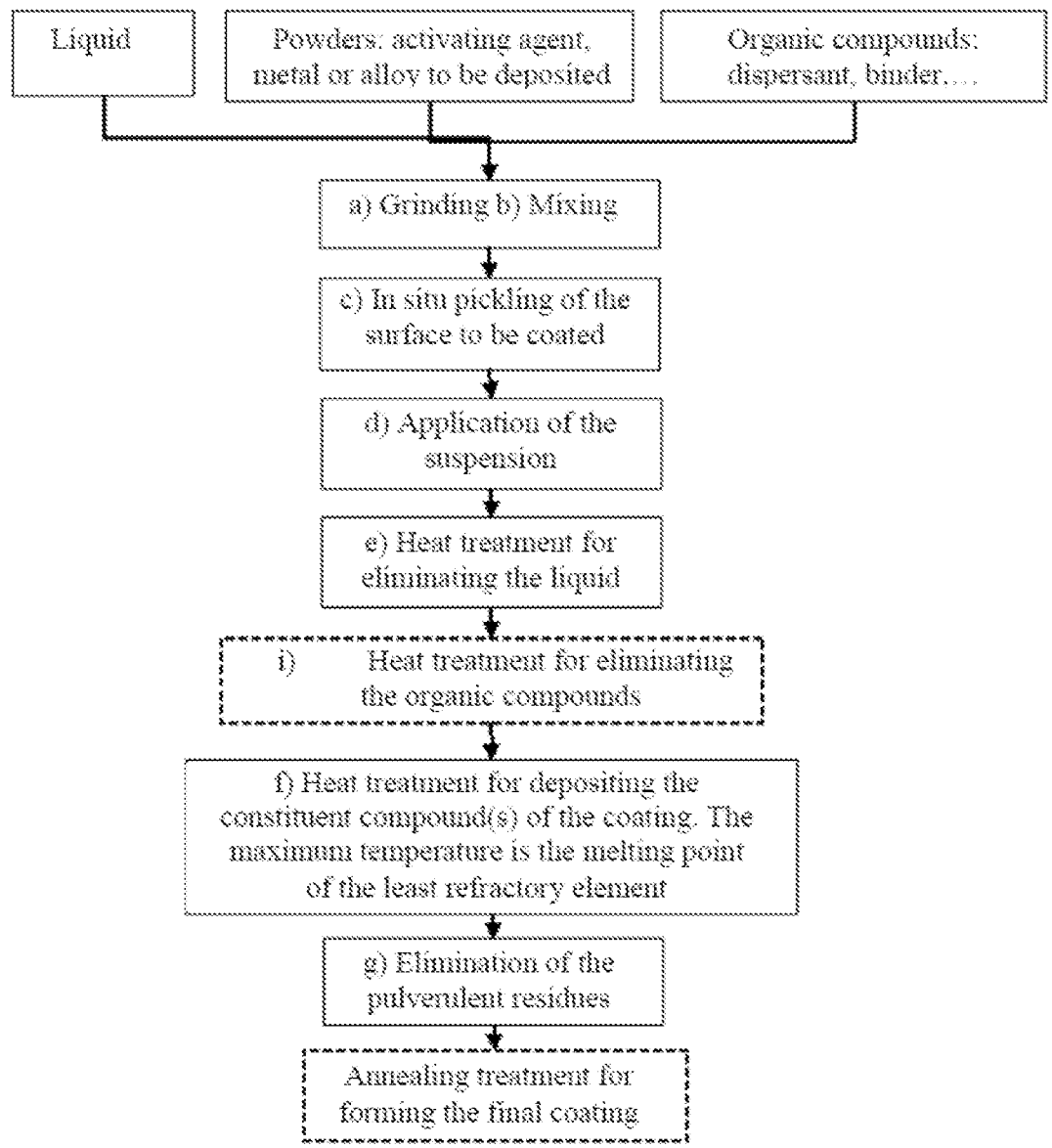
FIG. 1 is a flow chart showing steps of a first process according to the invention.

FIG. 1 schematically shows the various steps of the process according to the invention.

The first step (step a) is a step of grinding a powder of an activating agent and a powder of the metal or of the alloy to be deposited on the substrate. This grinding step makes it possible to obtain a particle size suitable for the part to be coated. Preferably, the substrate has cavities of minimum equivalent diameter $e_{cm}$ and the grinding step a) is carried out so as to obtain only particles having an equivalent diameter d such that $d \leq e_{cm}/10$. These powders must be able to be dispersed homogeneously in the liquid phase. The presence of agglomerates may lead to blocking of the entrance of the substrate cavities. The main difficulty consists in dispersing powders of different natures within a same suspension so as to obtain a homogeneous distribution of the elements in the suspension and a homogeneous deposition.

The second step (step b) is a step of mixing the powders ground in step a) and a liquid so as to form a suspension. Organic compounds of binder or lubricant type may be added to the suspension, in particular to promote wetting on the surface to be coated and to control the thickness deposited. The characteristics of the suspension must also be adapted to the chosen application technique.

The third step (step c) is a step of pickling the portion of the substrate to be coated. Without pickling of the surface of the part to be coated, no deposition is possible. Pickling enables a better adhesion of the coating on the substrate and a better uniformity of the deposition since the precursor is decomposed at the surface of the part with a catalytic effect of the surface. If there are impurities, the deposition may be degraded.

The fourth step (step d) is a step of applying the suspension to the portion of the substrate to be coated. The application and in particular the application to the inside of the cavities of the substrate may be carried out according to several processes: immersion of the substrate in the suspension; injection of the suspension into the cavity of the substrate; or brush application of the suspension to the cavity of the substrate. Zones that do not have to be covered may be protected by a mask that will be removed before or during the heating steps. After the deposition of the suspension at the surface of the substrate, the excess may be eliminated if necessary.

The fifth step (step e) is a first step of heating the substrate-suspension assembly at a temperature of between 50° C. and 300° C. and for a duration of between 30 min and 5 h so as to at least partly eliminate the liquid. The temperature is set as a function of the nature of the liquid (examples: ethanol, water). In order to facilitate the elimination of the liquid, gas flushing may be introduced inside the part in order to renew the atmosphere. During this step, the critical point is not to degrade the deposition.

The following step (step i) is an intermediate step since it depends on the presence or absence of organic compounds in the suspension. This step is a step of heating the substrate-suspension assembly resulting from step e) at a temperature of between 400° C. and the melting point of the least refractory element of the metal or of the alloy to be deposited and for a duration of between 1 and 10 hours so as to eliminate or degrade the organic compounds. As for the elimination of the liquid, gas flushing may be carried out in order to renew the atmosphere and eliminate the products of the degradation of the organic compounds.

The sixth step (step f) is a second step of heating the substrate-suspension assembly resulting from step e) at a temperature of between 500° C. and the melting point of the least refractory element of the metal or of the alloy to be deposited (for example 660° C. for aluminum) and for a duration of between 1 and 10 hours so as to react the activating agent and the metal or the alloy to be deposited. This treatment will preferably be carried out in a static atmosphere in order to avoid a rapid depletion of the element that forms the coating (aluminum) from the atmosphere. For this, the cavity or cavities may be blocked. In the latter case, it will be necessary to pay particular attention to the increase in pressure in the part. It will also be possible to place the open cavity in a bed of cement powder so that the latter saturates the atmosphere that is the precursor of the element (s) to be deposited.

Steps e) and i) could be carried out simultaneously or successively in the case where the temperature difference between the temperature of the degradation of the organics (step i) and the temperature of the reaction between the activating agent and the metal or the alloy to be deposited (step f) is large enough (temperature difference of between 50-100° C.). In the opposite case, it will be preferred to carry out step e) independently of steps i) and f) which could be carried out simultaneously.

The seventh step (step g) is a step of eliminating pulverulent residues. Several techniques may be used such as washing with aqueous solutions, chemical etching, erosion, etc.

The eighth step (step h) is a step of recovering a substrate-coating assembly.

The process according to the invention may comprise a last step of heating the substrate-coating assembly at a temperature of between 900° C. and 1200° C. and for a duration of between 1 and 5 hours.

Figure 2:
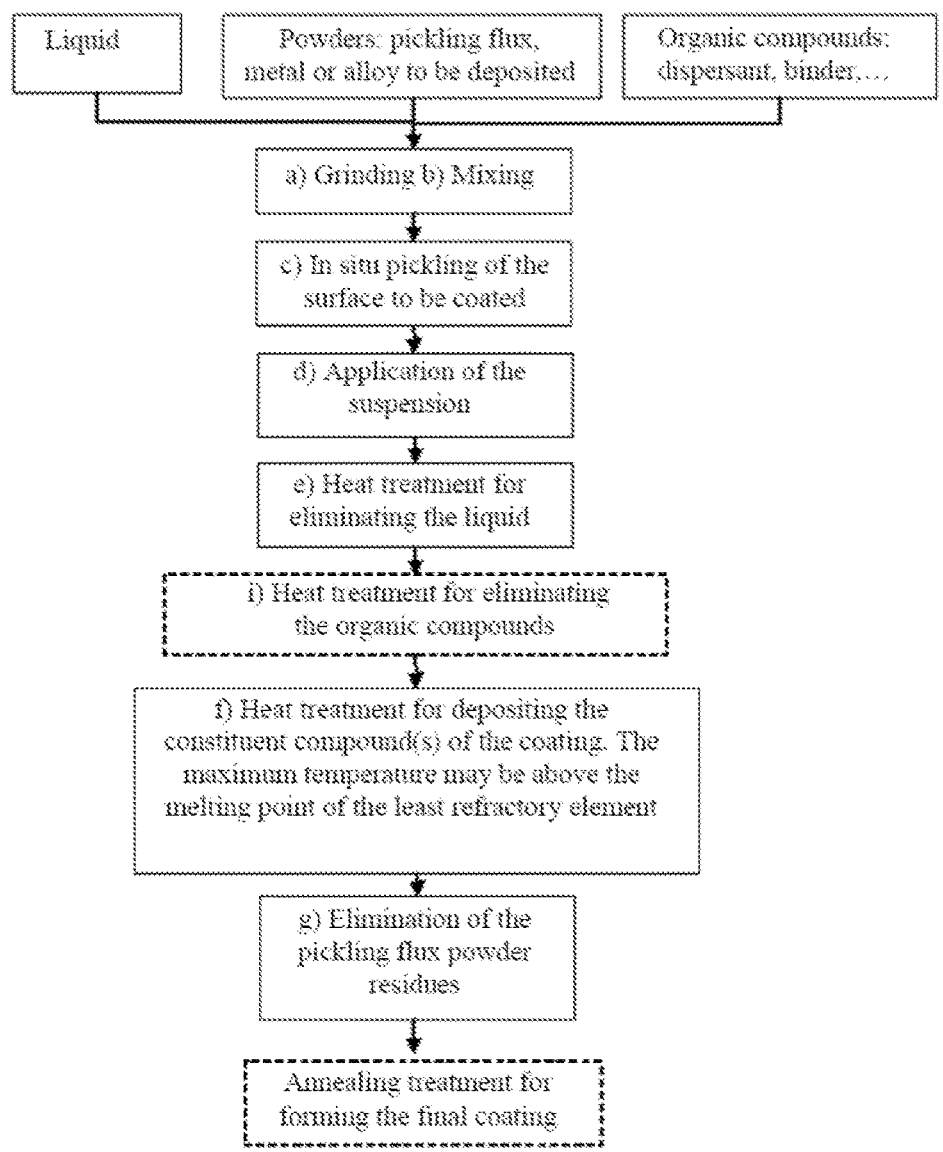
FIG. 2 is a flow chart showing steps of a second process according to the invention.

FIG. 2 schematically shows the various steps of the alternative process.

Since the alternative process is very similar to the process described above, only the steps which are modified will be described in detail.

The first step (step a) is a step of grinding a powder of a pickling flux and a powder of the metal or of the alloy to be deposited on the substrate. Preferably, the pickling flux has a low melting point, i.e. . . . An example of pickling flux is $K_3AlF_6$-$KAlF_4$.

The sixth step (step f) is a second step of heating the substrate-suspension assembly resulting from step e) at a temperature above the melting point of the pickling flux for a duration of between 20 min and 6 h so as to react the pickling flux and the metal or the alloy to be deposited.

This alternative process has the advantage of enabling a heat treatment at higher temperature than the first process which is limited by the lowest melting point of the elements to be deposited. This degree of freedom may be advantageous for the elimination of the organic compounds used for producing the suspension. Specifically, a temperature of 600 to 800° C. may be necessary in certain cases for completely degrading these organic compounds.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

What is claimed is:

1. A process for depositing a coating on a substrate having at least one cavity of minimum equivalent diameter $e_{cm}$, comprising the following successive steps:
   a) grinding a powder of an activating agent and a powder of a metal or of an alloy to be deposited on the substrate, said grinding being carried out so as to obtain only particles having an equivalent diameter d such that $d \leq e_{cm}/10$;
   b) mixing the ground powders and a liquid so as to form a suspension;
   c) pickling the portion of the substrate to be coated;
   d) applying the suspension to the pickled portion to provide a substrate-suspension assembly;
   e) heating the substrate-suspension assembly to a temperature of between 150° C. and 400° C. and for a duration of between 20 and 60 minutes so as to at least partly eliminate the liquid;
   f) further heating the substrate-suspension assembly resulting from step e) to a temperature of between 500° C. and a melting point of a least refractory element of the metal or of the alloy to be deposited and for a duration of between 1 and 10 hours so as to react the activating agent and the metal or the alloy to be deposited, completion of step f) resulting in production of a substrate-coating assembly and pulverulent residues;

g) eliminating the pulverulent residues from the substrate-coating assembly; and a last step of heating the substrate-coating assembly at a temperature of between 900° C. and 1200° C. and for a duration of between 1 and 5 hours.

2. The process of claim 1, wherein application of the suspension to the pickled portion is carried out by immersing the substrate in the suspension, by injecting the suspension into the at least one cavity of the substrate, or by brush application of the suspension to the at least one cavity of the substrate.

3. The process of claim 1, wherein step g) of eliminating the residues is carried out by vibration or washing with aqueous solutions.

4. The process of claim 1, wherein the substrate is selected from metallic substrates, substrates made of alloy(s) or made of superalloy(s), composite substrates comprising one or more metals and/or alloy(s) and/or superalloy(s) containing Ni in order to react with Al deposited and form NiAl.

5. The process of claim 1, wherein the substrate is a metallic heat exchanger.

6. The process of claim 1, wherein step e) is carried out under an atmosphere that is renewed every x minutes with $1\ min \leq x \leq 20\ min$.

7. The process of claim 1, wherein step f) is carried out under a static inert gas atmosphere.

8. The process of claim 7, wherein the inert gas is argon.

9. The process of claim 8, wherein in step b) at least one organic compound is added to the mixture.

10. The process of claim 9, wherein the at least one organic compound is selected from the group consisting of binders, lubricants and dispersants.

11. The process of claim 10, wherein said process further comprises, between step e) and step f), a step of heating the substrate-suspension assembly resulting from step e) to a temperature of between 400° C. and a melting point of a least refractory element of the metal or of the alloy to be deposited and for a duration of between 1 and 10 hours so as to eliminate or degrade the at least one organic compound.

12. The process of claim 11, wherein said step of heating the substrate-suspension assembly resulting from step e) is carried out under an atmosphere that is renewed every x minutes with $1\ min \leq x \leq 20\ min$.

* * * * *